US009520452B2

(12) United States Patent
Lim et al.

(10) Patent No.: US 9,520,452 B2
(45) Date of Patent: Dec. 13, 2016

(54) ORGANIC LIGHT-EMITTING DISPLAY APPARATUS WITH COLOR FILTER

(71) Applicant: Samsung Display Co., Ltd., Yongin, Gyeonggi-Do (KR)

(72) Inventors: Jae-Ik Lim, Yongin (KR); Jae-Kyoung Kim, Yongin (KR)

(73) Assignee: Samsung Display Co., Ltd., Gyeonggi-Do (KR)

(*) Notice: Subject to any disclaimer, the term of this patent is extended or adjusted under 35 U.S.C. 154(b) by 0 days.

(21) Appl. No.: 14/702,526

(22) Filed: May 1, 2015

(65) Prior Publication Data

US 2015/0236295 A1 Aug. 20, 2015

Related U.S. Application Data

(63) Continuation of application No. 13/914,210, filed on Jun. 10, 2013, now Pat. No. 9,041,035.

(30) Foreign Application Priority Data

Feb. 28, 2013 (KR) .................. 10-2013-0022451

(51) Int. Cl.
*H01L 27/32* (2006.01)
*H01L 51/52* (2006.01)

(52) U.S. Cl.
CPC ......... *H01L 27/3246* (2013.01); *H01L 27/322* (2013.01); *H01L 27/3211* (2013.01); *H01L 51/5218* (2013.01); *H01L 51/5221* (2013.01); *H01L 51/5262* (2013.01); *H01L 51/5271* (2013.01)

(58) Field of Classification Search
CPC .................. H01L 27/3211; H01L 27/3246
See application file for complete search history.

(56) References Cited

U.S. PATENT DOCUMENTS

| | | | |
|---|---|---|---|
| 2005/0046342 A1 | 3/2005 | Park et al. | |
| 2006/0175961 A1 | 8/2006 | Choong | |
| 2009/0322657 A1* | 12/2009 | Na | H01L 27/3246 345/76 |
| 2010/0026170 A1* | 2/2010 | Kim | H01L 51/5281 313/504 |
| 2010/0171105 A1* | 7/2010 | Kim | H01L 27/322 257/40 |
| 2011/0024780 A1 | 2/2011 | Park et al. | |
| 2013/0001603 A1 | 1/2013 | Lim et al. | |

FOREIGN PATENT DOCUMENTS

| | | | |
|---|---|---|---|
| KR | 10-2005-0052291 A | 6/2005 | |
| KR | 10-2010-0131074 A | 12/2010 | |
| KR | 10-2013-0007421 A | 1/2013 | |

* cited by examiner

*Primary Examiner* — Daniel Luke
(74) *Attorney, Agent, or Firm* — Knobbe, Martens, Olson & Bear, LLP (57) ABSTRACT

In an aspect, an organic light-emitting display apparatus is provided, including: an insulating layer having a inclined structure; a first electrode disposed on the insulating layer; a selective wavelength transparent layer disposed on the first electrode; a pixel defined layer disposed on the insulating layer and the first electrode and defining an emissive region and a non-emissive region; an organic emissive layer disposed on the first electrode; and a second electrode disposed on the organic emissive layer.

11 Claims, 5 Drawing Sheets

ORGANIC LIGHT-EMITTING DISPLAY APPARATUS WITH COLOR FILTER

INCORPORATION BY REFERENCE TO RELATED APPLICATIONS

Any and all priority claims identified in the Application Data Sheet, or any correction thereto, are hereby incorporated by reference under 37 CFR 1.57. For example, this application is a continuation of and claims priority to U.S. application Ser. No. 13/914,210, filed Jun. 10, 2013 which claims priority to and the benefit of Korean Patent Application No. 10-2013-0022451, filed on Feb. 28, 2013, in the Korean Intellectual Property Office, each of which is incorporated herein by reference in its entirety.

BACKGROUND

Field

This disclosure relates to an organic light-emitting display apparatus, and more particularly, to an organic light-emitting display apparatus having excellent light efficiency and that is capable of reducing reflectivity of external light.

Description of the Related Technology

Generally, an organic light-emitting display apparatus is a self-emission display which is formed by using an organic light-emitting diode (OLED) which includes a hole-injecting electrode, an electron-injecting electrode, and an organic light-emitting layer formed therebetween. The organic light-emitting display apparatus emits light when an exciton, generated when a hole injected from the hole-injecting electrode and an electron injected from the electron-injecting electrode are combined, drops from an excitation state to a ground state.

Since the organic light-emitting display apparatus, which is a self-emission display, does not need an additional power source, it may be driven with a low voltage, and may be formed of light films. Additionally, the organic light-emitting display apparatus provides high-quality characteristics such as wide viewing angles, high contrast, and a rapid response. Thus, an organic light-emitting display apparatus receives consideration as a next-generation display apparatus.

SUMMARY

The present disclosure provides an organic light-emitting display apparatus having excellent light efficiency and that is capable of reducing reflectivity of external light.

According to an aspect of the present disclosure, there is provided an organic light-emitting display apparatus including: an insulating layer having a inclined structure; a first electrode disposed on the insulating layer; a selective wavelength transparent layer disposed on the first electrode; a pixel defined layer disposed on the insulating layer and the first electrode and defining an emissive region and a non-emissive region; an organic emissive layer disposed on the first electrode; and a second electrode disposed on the organic emissive layer.

In some embodiments, the first electrode may be provided on a bottom surface and a sidewall of the inclined structure.

In some embodiments, the pixel defined layer may extend on an upper surface of the insulating layer, and the emissive region may include an opening exposing the first electrode.

In some embodiments, the pixel defined layer may cover the selective wavelength transparent layer.

In some embodiments, an N (N≥3, N is an integer) number of low refractive index layers and an N number of high refractive index layers may be alternately stacked in the selective wavelength transparent layer.

In some embodiments, a difference in a refractive index between the N number of low refractive index layers and the N number of high refractive index layers may be equal to or greater than 0.5.

In some embodiments, a thickness of one of the N number of low refractive index layers may be greater than thicknesses of the other low refractive index layers. In some embodiments, one of the low refractive index layers has a thickness $T^1$ and each of the other low refractive index layers has a thickness $T^2$. In some embodiments, the thickness $T^1$ is greater than the thicknesses $T^2$.

In some embodiments, a thickness of an intermediate layer of the low refractive index layers may be greater than thicknesses of the other low refractive index layers.

In some embodiments, a sidewall of the inclined structure may have a tilt angle in a range from about 20 degrees to about 70 degrees with respect to an extending line of a bottom surface of the inclined structure.

In some embodiments, the inclined structure may have a recess shape, and the first electrode may have a concave shape.

In some embodiments, the first electrode may be disposed on a sidewall of the inclined structure, and reflect light generated in the organic emissive layer.

In some embodiments, the inclined structure may have a protruding shape, and the first electrode may have a convex shape.

In some embodiments, the first electrode may be a transparent electrode, and the second electrode may be a bottom emissive type including a reflective layer.

According to another aspect of the present disclosure, there is provided an organic light-emitting display apparatus including: a substrate; an insulating layer disposed on the substrate and including a recess having a inclined surface; an organic light-emitting diode (OLED) disposed on the insulating layer and including a first electrode, an organic emissive layer, and a second electrode; a pixel defined layer disposed between the first electrode and the second electrode and defining an emissive region and a non-emissive region; and a selective wavelength transparent layer provided on the inclined surface.

In some embodiments, the first electrode may be disposed on the inclined surface.

In some embodiments, the insulating layer may further comprise a plurality of recesses, and the OLED may be disposed in each of the recesses.

In some embodiments, an N (N≥3, N is an integer) number of low refractive index layers and an N number of high refractive index layers may be alternately stacked in the selective wavelength transparent layer, wherein a thickness of one of the N number of low refractive index layers is different from thicknesses of the other low refractive index layers. In some embodiments, one of the low refractive index layers has a thickness $T^3$ and each of the other low refractive index layers has a thickness $T^4$, and wherein thickness $T^3$ is different than the thicknesses $T^4$.

In some embodiments, the organic light-emitting display apparatus may further include: a thin film transistor connected to the first electrode.

In some embodiments, the organic light-emitting display apparatus may further include: a sealing film covering the OLED.

In some embodiments, the first electrode may include a reflective layer.

According to another aspect of the present disclosure, there is provided an organic light-emitting display apparatus including: a substrate; an insulating layer disposed on the substrate and including a plurality of recesses each having a inclined surface; a plurality of OLEDs disposed on the insulating layer and including a first electrode, an organic emissive layer, and a second electrode; and a pixel defined layer disposed between the first electrode and the second electrode and defining an emissive region and a non-emissive region, wherein the pixel defined layer is a color filter.

In some embodiments, the inclined surface may have a tilt angle in a range from about 20 degrees to about 70 degrees with respect to a parallel line of the substrate.

In some embodiments, the first electrode may be disposed on the inclined surface.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION

The present disclosure will now be described more fully with reference to the accompanying drawings, in which exemplary embodiments are shown. Like reference numerals in the drawings denote like elements, and thus their description will be omitted. In the drawings, the lengths and sizes of elements are exaggerated for clarity and convenience of description.

This disclosure may be embodied in many different forms and should not be construed as limited to the exemplary embodiments set forth herein. For example, it will be understood that when a layer is referred to as being "on" or "on the top of" another layer, the layer can be directly on another layer or intervening or layers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including," when used herein, specify the presence of stated steps, operations, and/or elements, but do not preclude the presence or addition of one or more other steps, operations, and/or elements. It will be understood that, although the terms, 'first', 'second', etc. may be used herein to describe various elements, these elements should not be limited by these terms. These terms are only used to distinguish one element from another.

As used herein, the term "and/or" includes any and all combinations of one or more of the associated listed items. Expressions such as "at least one of," when preceding a list of elements, modify the entire list of elements and do not modify the individual elements of the list.

Figure 1:
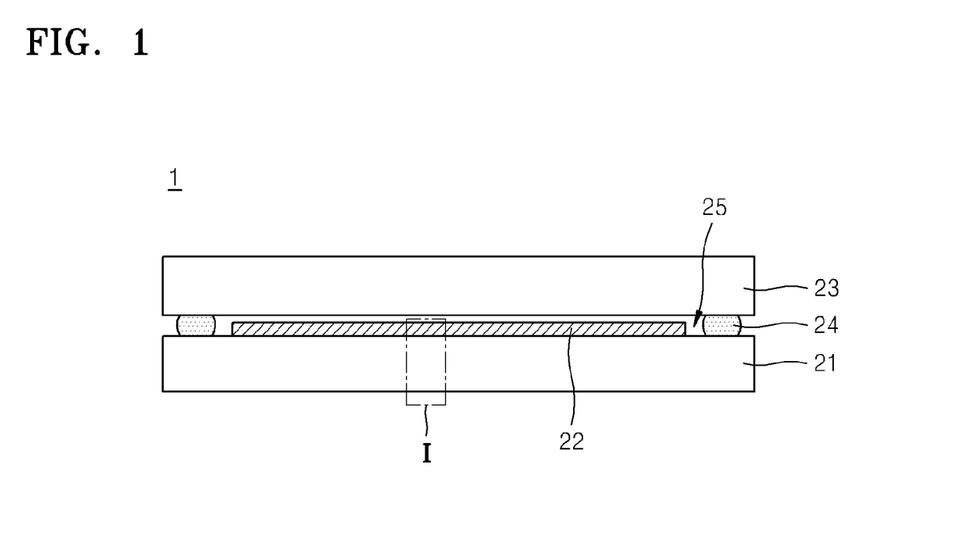
FIG. 1 is a cross-sectional view of an organic light-emitting display apparatus according to an embodiment of the present invention.
Figure 2:
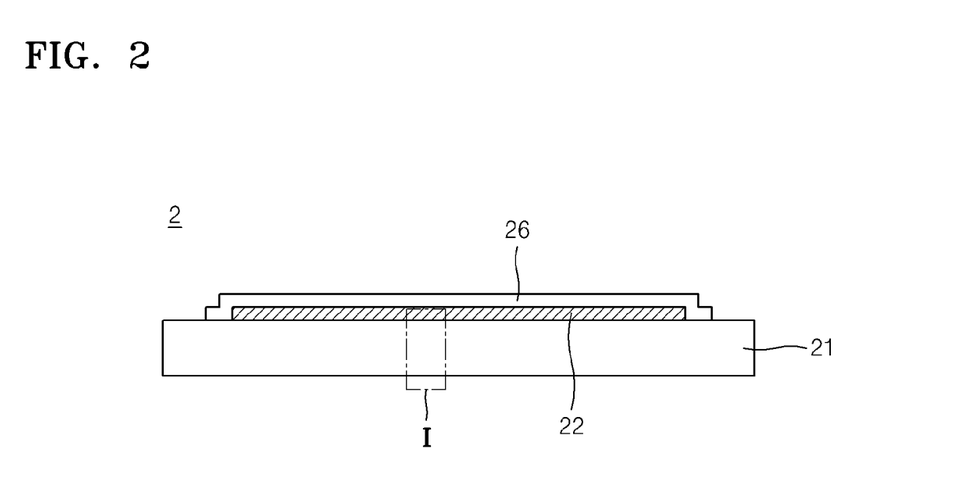
FIG. 2 is a cross-sectional view of an organic light-emitting display apparatus according to another embodiment of the present invention.

FIGS. 1 and 2 are cross-sectional views of organic light-emitting display apparatuses 1 and 2, according to embodiments of the present invention.

Referring to FIG. 1, the organic light-emitting display apparatus 1 includes an organic emissive portion 22 provided on a substrate 21 and a sealing substrate 23 that seals the organic emissive portion 22.

In some embodiments, the organic emissive portion 22 may include a plurality of organic light-emitting diodes (OLEDs) that emit one of red, green, blue, and white colors, as described later.

In some embodiments, the sealing substrate 23 may be formed of a transparent material to form an image from the organic emissive portion 22 and to prevent oxygen and moisture from reaching the organic emissive portion 22.

Edges of the substrate 21 and the sealing substrate 23 are coupled to each other by using a sealing member 24 so that an inner space 25 between the substrate 21 and the sealing substrate 23 is sealed. In some embodiments, a moisture absorbent or a filler may be disposed in the inner space 25.

Referring to FIG. 2, the organic light-emitting display apparatus 2 includes the organic emissive portion 22 provided on the substrate 21 and a sealing film 26 that seals the organic emissive portion 22.

The organic light-emitting display apparatus 2 of FIG. 2 is different from the organic light-emitting display apparatus 1 of FIG. 1 in that the organic light-emitting display apparatus 2 includes the sealing film 26 that is a thin film instead of the sealing substrate 23 of FIG. 1. In some embodiments, the sealing film 26 may cover the organic emissive portion 22 to protect the organic emissive portion 22 from external air. For example, the sealing film 26 may have a structure in which an inorganic layer formed of an inorganic substance such as silicon oxide or silicon nitride and an organic layer formed of an organic substance such as epoxy or polyimide are alternately formed.

In some embodiments, the number of inorganic layers or organic layers may be plural.

In some embodiments, the organic layer may be formed of polymer, and be a single layer or multi-layer formed of one selected from the group consisting of polyethylene terephthalate, polyimide, polycarbonate, epoxy, polyethylene, and polyacrylate. In some embodiments, the organic layer may also be formed of polyacrylate, and, more particularly, include a high molecular monomer component including a diacrylate-based monomer and a triacrylate-based monomer. In some embodiments, the monomer component may further include a monoacrylate-based monomer. In some embodiments, the monomer component may further include a well-known photoinitiator such as TPO (2,4,6-Trimethylbenzoyl-diphenyl-phosphineoxide) but it is not limited thereto.

In some embodiments, the inorganic layer may be a single layer or multi-layer including metal oxide or metal nitride.

In some embodiments, the inorganic layer may include one selected from the group consisting of SiNx, $Al_2O_3$, $SiO_2$, $TiO_2$, etc.

In some embodiments, an uppermost layer of the sealing film 26 that is exposed to the outside may be an inorganic layer so as to prevent moisture from reaching an OLED.

In some embodiments, the sealing film 26 may include at least one sandwich structure in which at least one organic layer is disposed between at least two inorganic layers. In some embodiments, the sealing film 26 may include at least one sandwich structure in which at least one inorganic layer is disposed between at least two organic layers.

In some embodiments, the sealing film 26 may sequentially include a first inorganic layer, a first organic layer, and a second inorganic layer from an upper portion of the organic emissive portion 22. In some embodiments, the sealing film 26 may also include the first inorganic layer, the first organic layer, the second inorganic layer, a second organic layer, and a third inorganic layer from the upper portion of the organic emissive portion 22. In some embodiments, the sealing film 26 may also include the first inorganic layer, the first organic layer, the second inorganic layer, the second organic layer, the third inorganic layer, a third organic layer, and a fourth inorganic layer from the upper portion of the organic emissive portion 22.

In some embodiments, a halogenized metal layer including LiF may be further disposed between the organic emissive layer 22 and the first inorganic layer. In some embodiments, the halogenized metal layer may prevent the organic emissive layer 22 from being damaged when the first inorganic layer is formed using a sputtering method or plasma deposition method.

In some embodiments, the first organic layer may have a narrower area than that of the second inorganic layer. In some embodiments, the second organic layer may also have a narrower area than that of the third inorganic layer. In some embodiments, the first organic layer may be entirely covered by the second inorganic layer. In some embodiments, the second organic layer may also be entirely covered by the third inorganic layer.

As another example, the sealing film 26 may have a film structure including low melting glass such as tin oxide (SnO). However, this is merely exemplary and the sealing film 26 is not necessarily limited thereto.

Figure 3:
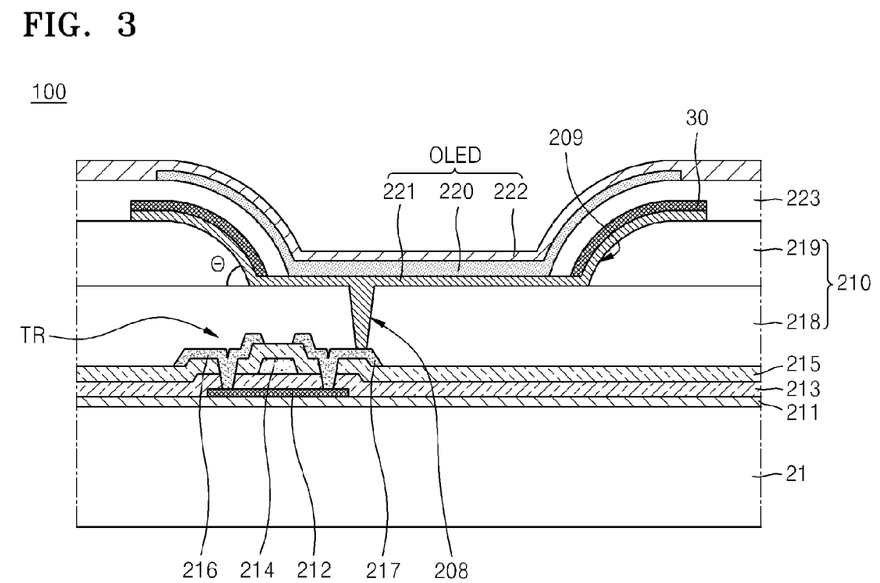
FIG. 3 is a schematic cross-sectional view of a region I of FIGS. 1 and 2.

FIG. 3 is a schematic cross-sectional view of region I of FIGS. 1 and 2.

Referring to FIG. 3, an organic light-emitting display apparatus 100 may include the substrate 21, a buffer film 211, a thin film transistor TR, an insulating layer 210 including an inclined structure 209, an OLED, a pixel defined layer 223, and a selective wavelength transparent layer 30.

In some embodiments, the substrate 21 may be formed of transparent glass having silicon dioxide ($SiO_2$) as a main component. However, the substrate 21 is not necessarily limited thereto, and may be formed of various materials such as ceramic, transparent plastic, metal, and the like.

In some embodiments, the buffer film 211 may function to prevent impurity ions, moisture, or external air from reaching an upper surface of the substrate 21 and planarize a surface of the substrate 21. In some embodiments, the buffer film 211 may be formed of an inorganic substance such as silicon oxide, silicon nitride, silicon oxynitride, aluminum oxide, aluminum nitride, titanium oxide, or titanium nitride, etc., an organic substance such as polyimide, polyester, acryl, etc., or a stack structure of the inorganic substance and the organic substance. The buffer film 211 is not an indispensable element and may not be provided according to circumstances. In some embodiments, the buffer film 211 may be formed by using diverse deposition methods such as plasma-enhanced chemical vapor deposition (PECVD), atmospheric pressure chemical vapor deposition (APCVD), low pressure CVD (LPCVD), and the like.

The thin film transistor TR includes an active layer 212, a gate electrode 214, and source and drain electrodes 216 and 217. A gate insulating layer 213 for insulating the gate electrode 214 from the active layer 212 is disposed between the gate electrode 214 and the active layer 212.

In some embodiments, the active layer 212 may be provided on the buffer film 211. In some embodiments, the active layer 212 may use an inorganic semiconductor or an organic semiconductor such as amorphous silicon or polysilicon. In some embodiments, the active layer 212 may be formed of an oxide semiconductor. For example, the oxide semiconductor may include an oxide of at least one material selected from metal elements in Groups 12 through 14 consisting of zinc (Zn), indium (In), gallium (Ga), stannum (Sn), cadmium (Cd), germanium (Ge), and hafnium (Hf), and a combination thereof.

In some embodiments, the gate insulating layer 213 may be provided on the buffer film 211 to cover the active layer 212. In some embodiments, the gate electrode 214 may be formed on the gate insulating layer 213.

In some embodiments, an interlayer insulating layer 215 may be formed on the gate insulating layer 213 to cover the gate electrode 214. In some embodiments, the source and drain electrodes 216 and 217 may be formed on the interlayer insulating layer 215 to contact the active layer 212 through contact holes.

The above-described structure of the thin film transistor TR is not necessarily limited thereto, and other structures of a thin film transistor TR may be applied. For example, the thin film transistor TR is formed as a top gate structure or may be formed as a bottom gate structure in which the gate electrode 214 is disposed below the active layer 212.

In some embodiments, a pixel circuit (not shown) including a capacitor and the thin film transistor TR may be formed.

In some embodiments, the insulating layer 210 may include the inclined structure 209. In some embodiments, the insulating layer 210 may be provided on the interlayer insulating layer 215 to cover the pixel circuit including the thin film transistor TR. In some embodiments, the insulating layer 210 may be composed of a plurality of insulating films.

In some embodiments, the inclined structure 209 includes a planarized bottom surface and a side wall having a tilt angle θ. In some embodiments, the inclined structure 209 may be provided to form a recess having inclined surface in a part of the insulating layer 210. The tilt angle θ refers to an angle formed by an extending line of a bottom surface and a side wall of the inclined structure 209 and may be adjusted through a process. An upper width of the inclined structure 209 may be greater than a lower width thereof since it has the side wall having the tilt angle θ. In some embodiments, the tilt angle θ may be in a range from about 20 degrees to about 70 degrees with respect to the extending line of the bottom surface.

In some embodiments, the insulating layer 210 may be formed of an inorganic substance and/or an organic substance. For example, the insulating layer 210 may include photoresist, acryl-based polymer, polyimide-based polymer, polyamide-based polymer, siloxane-based polymer, polymer including a photosensitive acryl carboxyl group, novolac resin, alkali soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, etc.

In some embodiments, the insulating layer 210 may include a first insulating layer 218 and a second insulating layer 219. In some embodiments, the first insulating layer 218 may be a single-layered or multi-layered insulating film having a planarized top surface. In some embodiments, the second insulating film 219 may be disposed on the first insulating layer 218 and have the inclined structure 209. In some embodiments, the first insulating layer 218 and the second insulating layer 219 may be formed of a same or similar material. In some embodiments, the first insulating layer 218 and the second insulating layer 219 may be also formed of different materials.

In some embodiments, the OLED may be disposed on the insulating layer 210 and may include a first electrode 221, an organic emissive layer 220, and a second electrode 222. In some embodiments, the pixel defined layer 223 may be disposed on the insulating layer 210 and the first electrode 221 and defines an emissive region and a non-emissive region.

In some embodiments, the organic emissive layer 220 may be formed of a low-molecular weight organic material or a polymer organic material. When the organic emissive layer 220 is formed of a low-molecular weight organic material, a hole injection layer (HIL), a hole transport layer (HTL), an emission layer (EML), an electron transport layer (ETL), an electron injection layer (EIL), etc. may be stacked to form a single or multiple structure. These low-molecular weight organic materials may be formed using a vacuum deposition method. In this regard, the organic emissive layer 220 may be independently formed for each of red R, green G, and blue B pixels. The HIL, the HTL, the ETL, and the EIL may be applied to the RGB pixels as common layers.

Otherwise, when the organic emissive layer 220 is formed of a polymer organic material, only an HIL may be included with respect to an EML in a direction of the first electrode 221. In some embodiments, the HIL may be formed of poly(3,4-ethylenedioxythiophene)(PEDOT) or polyaniline (PANI) and formed on an upper portion of the first electrode 221 using an inkjet printing method or a spin coating method. In this regard, a polyphenylene vinylene (PPV) or polyfluorene-based polymer organic substance may be used as an organic material, and a color pattern may be formed using a general method such as the inkjet printing method or the spin coating method or a thermal transfer method using laser.

In some embodiments, the HIL may be formed of a phthalocyanine component such as copper phthalocyanine or TCTA, m-MTDATA, m-MTDAPB, etc. that are starburst type amine derivatives.

In some embodiments, the HTL may be formed of N,N'-bis(3-methylphenyl)-N,N'-diphenyl-[1,1-biphenyl]-4,4'-diamine (TPD), N,N'-di(naphthalene-1-yl), N'-diphenyl benzidine (α-NPD), etc.

In some embodiments, the EIL may be formed of LiF, NaCl, CsF, Li2O, BaO, Liq, etc.

In some embodiments, the ETL may be formed of $Alq_3$.

In some embodiments, the EML may be formed of a host material and a dopant material.

In some embodiments, the host material may use Tris(8-hydroxyquilonato) aluminum (Alq3), 9,10-di(naphth-2-yl) anthracene (AND), 3-tert-butyl-9,10-di(naphth-2yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), Tert (9,9-diarylfluorene)-s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis-(9,9-diaryl-fluorene)s (BDAF), 4,4'-bis(2,2-diphenyl-ethene-1-yl)-4,4'-di-(tert-butyl) phenyl (p-TDPVBi), 1,3-bis(carbazole-9-yl)benzene (mCP), 1,3,5-tris(carbazole-9-yl)benzene (tCP), 4,4',4"-tris(carbazole-9-yl)triphenylamine (TcTa), 4,4'-bis(carbazole-9-yl) biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), etc.

In some embodiments, the dopant material may use 4,4'bis[4-(di-p-tolylamino)styryl]biphenyl (DPAVBi), 9,10-di(naph-2-thyl)anthracene (AND), 3-tert-butyl-9,10-di(naph2-thyl) anthracene (TBADN), etc.

In some embodiments, the first electrode 221 may be disposed on the insulating layer 210. In some embodiments, the first electrode 221 may be disposed on the side wall of the inclined structure 209 with respect to the bottom surface thereof. In some embodiments, the first electrode 221 may be at an angle that is the same as or similar to the tilt angle θ formed by the side wall of the inclined structure 209 with respect to the extending line of the bottom surface of the inclined structure 209. In some embodiments, the first electrode 221 may have a concave shape since it is disposed on the side wall of the inclined structure 209.

In a case where light generated in the organic emissive layer 220 is incident to the first electrode 221 disposed on the side wall of the inclined structure 209, the incident light may be reflected from the first electrode 221 and discharged to the outside. In this regard, the tilt angle θ may be adjusted in such a way that the light generated in the organic emissive layer 220 may be emitted in a desired direction. Accordingly, an efficiency of the light discharged from the OLED disposed on the inclined structure 209 to the outside may be improved.

In some embodiments, the first electrode 221 may be electrically connected to the drain electrode 217 of the thin film transistor TR via a through hole 208 that passes through the insulating layer 210. Although the through hole 208 is formed in the bottom surface of the inclined structure 209 in FIG. 3, the present embodiments are not limited thereto. In some embodiments, the through hole 208 may be formed in the side wall of the inclined structure 209 or in an upper surface of the insulating layer 210.

In some embodiments, the first electrode 221 may function as an anode and the second electrode 222 may function as a cathode. However, the polarities of the first and second electrodes 221 and 222 are not limited thereto and may be switched.

If the first electrode 221 functions as an anode, the first electrode 221 may include indium tin oxide (ITO), indium zinc oxide (IZO), zinc oxide (ZnO), or indium oxide ($In_2O_3$) having a high work function. If the organic light-emitting display device 1 is a top emission type for displaying an image in a direction opposite to the display substrate 21, the first electrode 221 may further include a reflective layer including metal such as silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca), or an alloy thereof. In some embodiments, the first electrode 221 may be formed as a monolayer or a multilayer including the above-mentioned metal or alloy. In some embodiments, the first electrode 221 may include an ITO/Ag/ITO structure as a reflective electrode.

If the second electrode 222 functions as a cathode electrode, the second electrode 222 may be formed of metal such as Ag, Mg, Al, Pt, Pd, Au, Ni, Nd, Ir, Cr, Li, or Ca. If the organic light-emitting display device 1 is a top emission type, the second electrode 222 should transmit light. In some embodiments, the second electrode 222 may include transparent conductive metal oxide such as ITO, IZO, zinc tin oxide (ZTO), ZnO, or $In_2O_3$. According to another embodiment, the second electrode 222 may be formed as a thin film including at least one selected from the group consisting of Li, Ca, LiF/Ca, LiF/Al, Al, Ag, Mg, and Yb. For example, the second electrode 222 may be formed as a monolayer or a multilayer including Mg:Ag, Ag:Yb, and/or Ag. Unlike the first electrode 221, the second electrode 222 may be formed to apply a common voltage to all pixels.

In some embodiments, the pixel defining layer 219 defines the pixel regions PA of the OLEDs and the non-pixel region NPA by using a plurality of openings for exposing the first electrode 221. In the opening of the pixel defining layer 219, the first electrode 221, the organic emission layer 220B or 220R, and the second electrode 222 may be sequentially stacked and the organic emission layer 220B or 220R may emit light. That is, a region where the pixel defining layer 219 is formed substantially corresponds to the non-pixel region NPA, and the openings of the pixel defining layer 219 substantially correspond to the pixel regions PA.

In some embodiments, the pixel defined layer 223 may be disposed on the insulating layer 210 and the first electrode 221 and may define the emissive region and the non-emissive region. In some embodiments, the pixel defined layer 223 may cover the first electrode 221 disposed on the side wall of the inclined structure 209 and extend on the upper surface of the insulating layer 210. In other words, the pixel defined layer 223 may be disposed between a part of the bottom surface and an upper part of the side wall of the inclined structure 209. A part of the pixel defined layer 223 is the non-emissive region. In some embodiments, an opening (not shown) pixel defined layer disposed between the pixel defined layers 223 and exposes the first electrode 221 may be the emissive region.

In some embodiments, the organic emissive layer 220 may be disposed on the pixel defined layer 223. In other words, the organic emissive layer 220 may be disposed on the first electrode 221 of the opening 223a and extend on the upper portion of the pixel defined layer 223.

In some embodiments, the pixel defined layer 223 may be formed of an organic material, an inorganic material, etc. For example, the pixel defined layer 223 may include an organic material such as photoresist, polyacryl-based resin, polyimide-based resin, acryl-based polymer, or an inorganic material such as a silicon compound.

A pixel is defined by the opening pixel defined layer between the pixel defined layers 223, and a single OLED is disposed for each pixel. Each pixel may be a red pixel, a green pixel, a blue pixel, or a white pixel according to a color emitted by the organic emissive layer 220 of the OLED.

In some embodiments, the selective wavelength transparent layer 30 may be provided to reduce reflection by external light while maintaining light efficiency that may be increased by the inclined structure 209.

In some embodiments, the selective wavelength transparent layer 30 may be provided on the first electrode 221 disposed on the side wall of the inclined structure 209. In some embodiments, the selective wavelength transparent layer 30 may transmit only light of a wavelength range generated in the organic emissive layer 220 of each pixel and may not transmit light of other wavelength ranges. In other words, a selective wavelength transparent layer 30 that transmits only a red light is provided in a red pixel, a selective wavelength transparent layer 30 that transmits only a green light is provided in a green pixel, and a selective wavelength transparent layer 30 that transmits only a blue light is provided in a blue pixel.

Thus, the light generated in the organic emissive layer 220 of each pixel and traveling to a side surface thereof may transmit through the selective wavelength transparent layer 30 disposed on a inclined surface and then may be reflected from the first electrode 221 and emitted to the outside, whereas most of the light incident from the outside may not transmit through the selective wavelength transparent layer 30 and may become extinct.

For example, the selective wavelength transparent layer 30 that transmits only the red light is provided in the red pixel so that the red light generated in the organic emissive layer 220 may transmit through the selective wavelength transparent layer 30. Then the light may be reflected from the first electrode 221 disposed on the inclined surface and be emitted to the outside, whereas visible light of the light incident from the outside, except for the red light, may not transmit through the selective wavelength transparent layer 30 and thus may not be reflected from the first electrode 221.

In some embodiments, the selective wavelength transparent layer 30 may be a red, green, or blue color filter according to each pixel. In some embodiments, the selective wavelength transparent layer 30 may have a structure in which low refractive index layers and high refractive index layers are alternately stacked, as described with reference to FIGS. 4 and 5 below.

Figure 4:
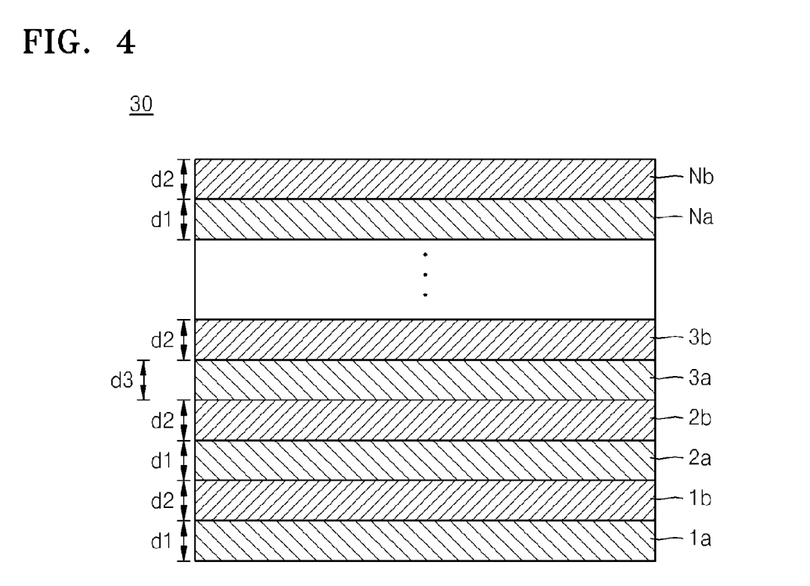
FIGS. 4 and 5 are schematic cross-sectional views of a selective wavelength transparent layer applied to embodiments of the present invention.
Figure 5:
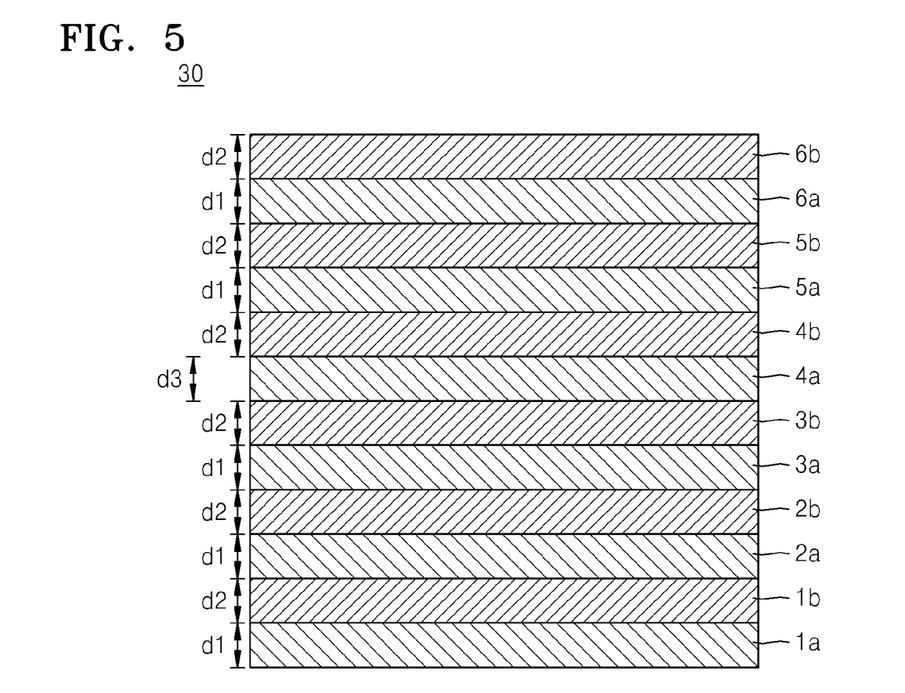

FIGS. 4 and 5 are schematic cross-sectional views of the selective wavelength transparent layer 30 applied to embodiments of the present invention.

Referring to FIG. 4, an N (N≥3, N is an integer) number of low refractive index layers 1a, 2a, 3a, . . . , Na and an N number of high refractive index layers 1b, 2b, 3b, . . . , Nb may be alternately stacked in the selective wavelength transparent layer 30. Although the low refractive index layer 1a is disposed as a lowermost layer of the selective wavelength transparent layer 30, the present embodiments are not limited thereto, and the high refractive index layer 1b may be disposed as a lowermost layer of the selective wavelength transparent layer 30.

A difference in a refractive index n between the low refractive index layers 1a, 2a, 3a, . . . , Na and the high refractive index layers 1b, 2b, 3b, . . . , Nb may be equal to or greater than approximately 0.5. A thickness d1 of each of the low refractive index layers 1a, 2a, 3a, . . . , Na and a thickness d2 of each of the high refractive index layers 1b, 2b, 3b, . . . , Nb may be designed such that a light path (nd, n denotes the refractive index, and d denotes a moving distance of light) is λ/4. In this regard, λ may denote a wavelength of light that may transmit through the selective wavelength transparent layer 30.

In this regard, a thickness d3 of at least one of the low refractive index layers 1a, 2a, 3a, . . . , Na may be different from the thickness d1 of the other layers. For example, the thickness d3 of at least one of the low refractive index layers 1a, 2a, 3a, . . . , Na may be greater than the thickness d1 of the other layers. In some embodiments, the low refractive index layer having a different thickness may be disposed in the middle of the selective wavelength transparent layer 30.

FIG. 5 shows the selective wavelength transparent layer 30 in a case where the low refractive index layers 1a~6a and the high refractive index layers 1b~6b are 6 pairs.

Referring to FIG. 5, the selective wavelength transparent layer 30 has a structure in which the low refractive index layer 1a, the high refractive index layer 1b, the low refractive index layer 2a, the high refractive index layer 2b, . . . , the low refractive index layer 6a, and the high refractive index layer 6b are stacked.

In some embodiments, the first through sixth low refractive index layers 1a~6a may have a same or similar refractive index. The first through sixth high refractive index layers 1b~6b may have a same or similar refractive index.

In some embodiments, the refractive index of each of the first through sixth low refractive index layers 1a~6a may be approximately 0.5 times or more smaller than that of each of the first through sixth high refractive index layers 1b~6b.

In some embodiments, the thickness d1 of the first, second, third, fifth, and sixth low refractive index layers 1a, 2a, 3a, 5a, and 6a may be the same or similar. In some embodiments, the thickness d2 of the first through sixth high refractive index layers 1b~6b may be the same or similar. In some embodiments, the thickness d1 may be smaller than the thickness d2.

In some embodiments, the fourth low refractive index layer 4a may have a thickness d3 that is different from those of the first, second, third, fifth, and sixth low refractive index layers 1a, 2a, 3a, 5a, and 6a. In some embodiments, the thickness d3 of the fourth low refractive index layer 4a may be 1.5 times or more greater than the thickness d1 of the first, second, third, fifth, and sixth low refractive index layers 1a, 2a, 3a, 5a, and 6a.

Figure 6A:
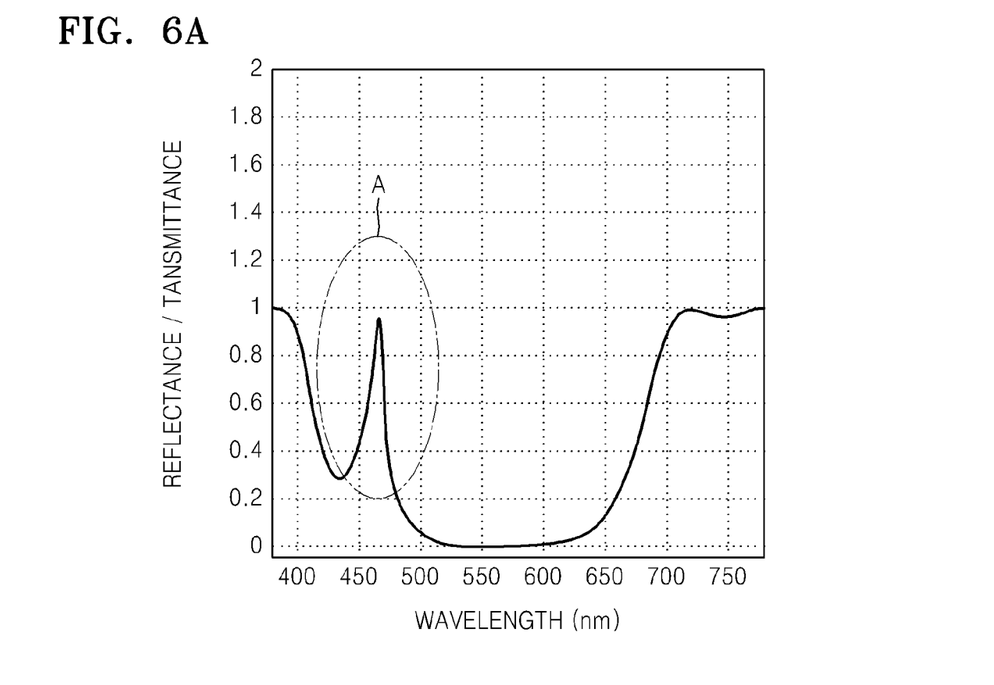
FIGS. 6A through 6C are graphs showing a characteristic of the selective wavelength transparent layer of FIG. 5 according to a design change thereof.
Figure 6B:
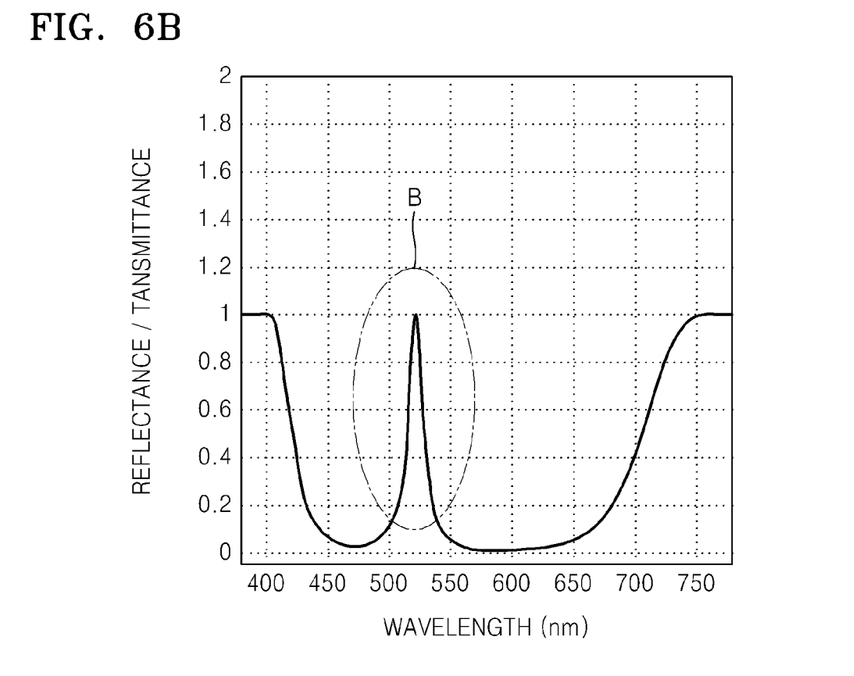
Figure 6C:
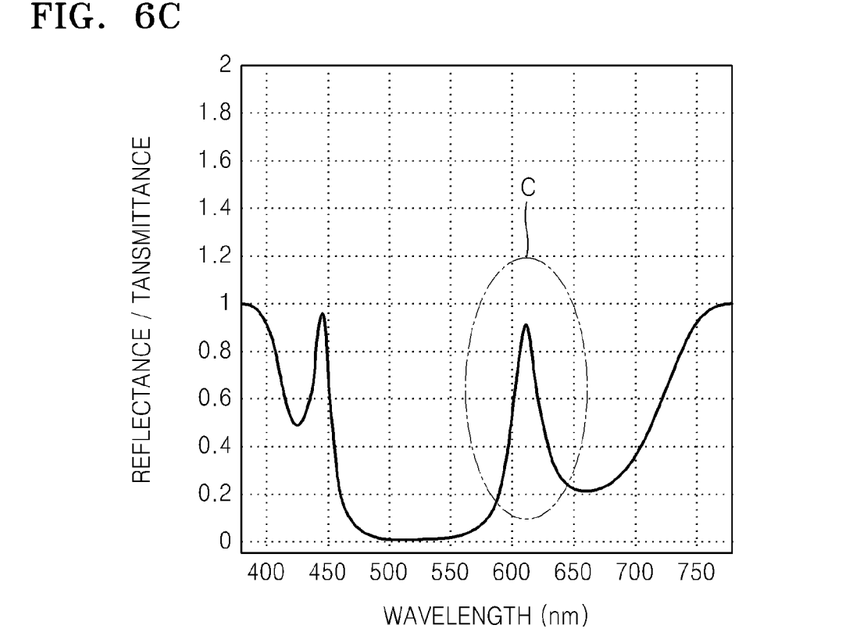

FIGS. 6A through 6C are graphs showing a characteristic of the selective wavelength transparent layer 30 of FIG. 5 according to a design change thereof.

Common design parameters with respect to data of FIGS. 6A through 6C are as follows:

1) Refractive index of the low refractive index layers 1a~6a: 1.5
2) Refractive index of the high refractive index layers 1b~6b: 2.3
3) Thickness d1 of the first, second, third, fifth, and sixth low refractive index layers 1a, 2a, 3a, 5a, and 6a: 70 nm
4) Thickness d2 of the high refractive index layers 1b~6b: 100 nm The data of FIGS. 6A through 6C shows the characteristic of the selective wavelength transparent layer 30 with respect to a change in the thickness d3 of the fourth low refractive index layer 4a.

Referring to FIG. 6A, the thickness d3 of the fourth low refractive index layer 4a is 140 nm. In this case, light of a wavelength from about 460 nm to about 470 nm in a visible light range may be transmitted like a region A, which represents a blue light.

Referring to FIG. 6B, the thickness d3 of the fourth low refractive index layer 4a is 220 nm. In this case, light of a wavelength from about 520 nm to about 530 nm in a visible light range may be transmitted like a region B, which represents a green light.

Referring to FIG. 6C, the thickness d3 of the fourth low refractive index layer 4a is 320 nm. In this case, light of a wavelength from about 610 nm to about 620 nm in a visible light range may be transmitted like a region C, which represents a red light.

As described above, the design change of the selective wavelength transparent layer 30 may be made by changing a thickness of one of a plurality of low refractive index layers so as to transmit light of a desired wavelength range.

The above-described design parameter is merely an example, and may be changed in various ways. For example, a difference in a refractive index, the number of low refractive index layers having different thicknesses, a location of a low refractive index layer having a different thickness, etc. may be changed. Also, the selective wavelength transparent layer 30 may be designed by changing a thickness of at least one of high refractive index layer instead of low refractive index layers.

Figure 7:
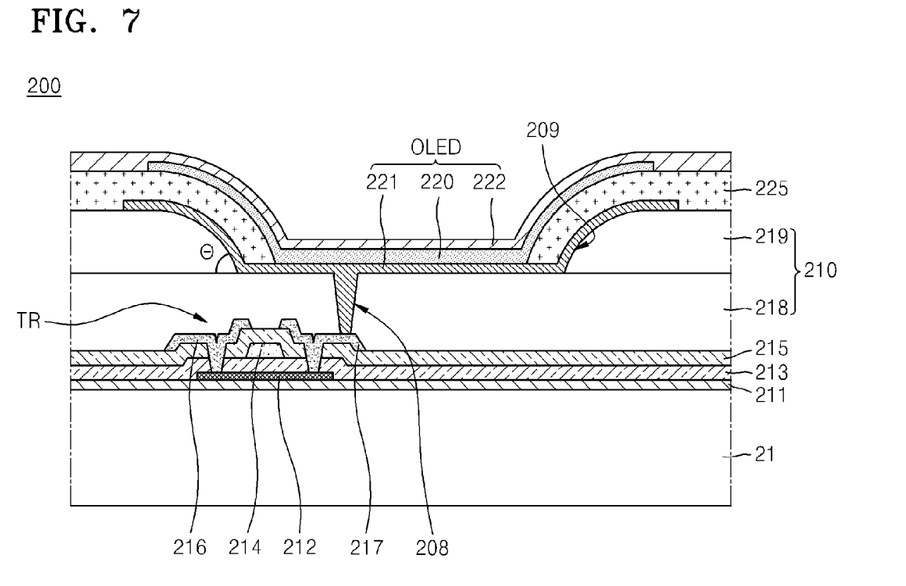
FIG. 7 is a schematic cross-sectional view of a region I of FIGS. 1 and 2, according to another embodiment of the present invention.

FIG. 7 is a schematic cross-sectional view of region I of FIGS. 1 and 2, according to another embodiment of the present invention. The same reference numerals between FIGS. 3 and 7 denote the same elements, and thus repeated descriptions thereof are omitted here for brevity of explanation.

Referring to FIG. 7, an organic light-emitting display apparatus 200 is different from the organic light-emitting display apparatus 100 of FIG. 3 in that the organic light-emitting display apparatus 200 does not include the selective wavelength transparent layer 30 and instead includes a pixel defined layer 225 functioning as the selective wavelength transparent layer 30.

In some embodiments, the pixel defined layer 225 may be a color filter. That is, the pixel defined layer 225 may transmit only light of a wavelength range generated in the organic emissive layer 220 of each pixel and may not transmit light of other wavelength ranges. In other words, a pixel defined layer 225 that transmits only a red light is provided in a red pixel, a pixel defined layer 225 that transmits only a green light is provided in a green pixel, and a pixel defined layer 225 that transmits only a blue light is provided in a blue pixel.

Thus, the light generated in the organic emissive layer 220 of each pixel and traveling to a side surface may transmit through the pixel defined layer 225 and then may be reflected from the first electrode 221 and emitted to the outside, whereas most of the light incident from the outside may not transmit through the pixel defined layer 225 and may become extinct.

Figure 8:
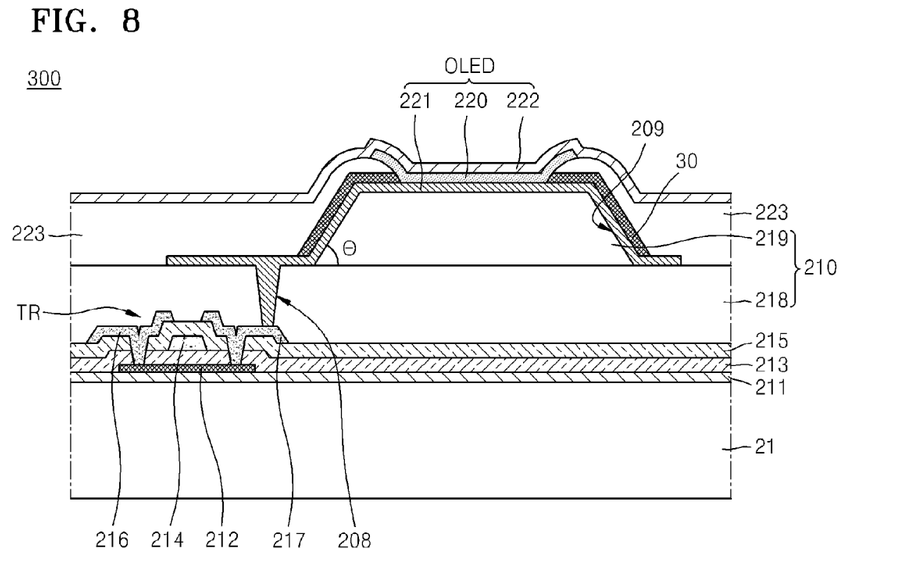
FIG. 8 is a schematic cross-sectional view of a region I of FIGS. 1 and 2, according to another embodiment of the present invention.

FIG. 8 is a schematic cross-sectional view of a region I of FIGS. 1 and 2, according to another embodiment of the present invention. The same reference numerals between FIGS. 3 and 8 denote the same elements, and thus repeated descriptions thereof are omitted here for brevity of explanation.

Referring to FIG. 8, an organic light-emitting display apparatus 300 is different from the organic light-emitting display apparatus 100 of FIG. 3 in that the organic light-emitting display apparatus 300 has a top emissive structure in which light is emitted in a direction of the substrate 21.

In some embodiments, the organic light-emitting display apparatus 300 may include an insulating layer 210 having a inclined structure 209 having a protruding shape. Also, an OLED may be provided on a protruding portion of the insulating layer 210. In this case, the first electrode 221 may be a transparent electrode and have a convex shape. In some embodiments, the second electrode 222 may include a reflective material.

In some embodiments, the selective wavelength transparent layer 30 may be disposed on the first electrode 221 disposed on the sidewall of the inclined structure 209. In some embodiments, the selective wavelength transparent layer 30 may transmit only light of a wavelength range generated in the organic emissive layer 220 of each pixel and may not transmit light of other wavelength ranges.

Thus, the light generated in the organic emissive layer 220 of each pixel and traveling in a direction of a side surface thereof may be reflected from the second electrode 222 and then emitted toward the substrate 21, whereas most of the light incident from the outside may not transmit through the selective wavelength transparent layer 30 and may become extinct, and thus an external light reflectivity of the organic light-emitting display apparatus 300 may be reduced.

It should be understood that example embodiments described herein should be considered in a descriptive sense only and not for purposes of limitation. Descriptions of features or aspects within each embodiment should typically be considered as available for other similar features or aspects in other embodiments. While some example embodiments have been particularly shown and described, it will be understood by one of ordinary skill in the art that variations in form and detail may be made therein without departing from the spirit and scope of the claims.

What is claimed is:

1. An organic light-emitting display apparatus comprising:
    a substrate;
    an insulating layer disposed on the substrate and comprising a first recess and a second recess having an inclined surface;
    a first organic light-emitting diode (OLED) disposed on the first recess and comprising a first pixel electrode, a first organic emissive layer, and a first opposite electrode, wherein the first organic emissive layer generates light of a first color having a first wavelength range;
    a second OLED disposed on the second recess and comprising a second pixel electrode, a second organic emissive layer, and a second opposite electrode, wherein the second organic emissive layer generates light of a second color having a second wavelength range;
    a first pixel defined layer disposed between the first pixel electrode and the first opposite electrode and defining a first emissive region; and
    a second pixel defined layer disposed between the second pixel electrode and the second opposite electrode and defining a second emissive region,
    wherein at least a portion of the first pixel defined layer is a first color filter selected to transmit only the light of the first color having the first wavelength range generated by the first organic emissive layer,
    wherein at least a portion of the second pixel defined layer is a second color filter selected to transmit only the light of the second color having the second wavelength range generated by the second organic emissive layer,
    wherein the first color is different than the second color.

2. The organic light-emitting display apparatus of claim 1, wherein the inclined surface has a tilt angle in a range from about 20 degrees to about 70 degrees with respect to a parallel line of the substrate.

3. The organic light-emitting display apparatus of claim 1, wherein the first pixel electrode is disposed on the inclined surface.

4. The organic light-emitting display apparatus of claim 1, wherein the first pixel electrode is provided on a bottom surface and a sidewall of the inclined surface.

5. The organic light-emitting display apparatus of claim 1, wherein the first pixel defined layer extends on an upper surface of the insulating layer, and the first emissive region comprises an opening exposing the first pixel electrode.

6. The organic light-emitting display apparatus of claim 1, wherein the first pixel electrode has a concave shape.

7. The organic light-emitting display apparatus of claim 1, wherein the first pixel electrode is disposed on a sidewall of the inclined surface, and reflects light generated in the first organic emissive layer.

8. The organic light-emitting display apparatus of claim 1, wherein the first pixel electrode is a transparent electrode, and the first opposite electrode is a bottom emissive type comprising a reflective layer.

9. The organic light-emitting display apparatus of claim 1, further comprising: a thin film transistor connected to the first pixel electrode.

10. The organic light-emitting display apparatus of claim 1, further comprising a sealing film covering the first OLED and the second OLED.

11. The organic light-emitting display apparatus of claim 1, wherein the first pixel defined layer comprises one or more low refractive index layers alternately stacked with one or more high refractive index layers.

* * * * *